United States Patent
de Boer

(10) Patent No.: US 9,823,288 B2
(45) Date of Patent: Nov. 21, 2017

(54) METHOD FOR MONITORING MULTIPLE ELECTRICAL ENERGY LINES IN A CABLE STRAND

(71) Applicant: Wobben Properties GmbH, Aurich (DE)

(72) Inventor: Joachim de Boer, Aurich (DE)

(73) Assignee: Wobben Properties GmbH, Aurich (DE)

( * ) Notice: Subject to any disclaimer, the term of this patent is extended or adjusted under 35 U.S.C. 154(b) by 200 days.

(21) Appl. No.: 14/432,941

(22) PCT Filed: Aug. 23, 2013

(86) PCT No.: PCT/EP2013/067588
§ 371 (c)(1),
(2) Date: Apr. 1, 2015

(87) PCT Pub. No.: WO2014/053273
PCT Pub. Date: Apr. 10, 2014

(65) Prior Publication Data
US 2015/0253369 A1 Sep. 10, 2015

(30) Foreign Application Priority Data

Oct. 2, 2012 (DE) .......................... 10 2012 218 067

(51) Int. Cl.
| G01R 31/02 | (2006.01) |
| H04B 3/46 | (2015.01) |
| H02H 5/04 | (2006.01) |
| H02H 7/22 | (2006.01) |
| G01K 13/00 | (2006.01) |

(52) U.S. Cl.
CPC ........... G01R 31/021 (2013.01); G01K 13/00 (2013.01); H02H 5/042 (2013.01); H02H 7/226 (2013.01); Y02E 10/721 (2013.01)

(58) Field of Classification Search
CPC ....... G01R 31/021; F03D 9/002; F03D 9/003; F03D 7/022; F03D 7/028; F03D 7/048; F03D 7/0292; F03D 7/0296; F03D 7/042
See application file for complete search history.

(56) References Cited

FOREIGN PATENT DOCUMENTS

| CN | 1698258 A | 11/2005 | |
|---|---|---|---|
| CN | 102422500 A | 4/2012 | |
| DE | 10 2005 022060 A1 | 1/2007 | |
| DE | 10 2009 021 217 A2 | 11/2010 | |
| DE | WO 2010130562 A1 * | 11/2010 | ............. H02H 5/042 |
| EP | 2 270 452 A2 | 1/2011 | |
| JP | 7193986 A | 7/1995 | |
| JP | 2004254456 A | 9/2004 | |
| JP | 2006246549 A | 9/2006 | |
| WO | 2004/107550 A1 | 12/2004 | |

OTHER PUBLICATIONS

WO 2010130562 translation.*

* cited by examiner

Primary Examiner — Minh N Tang
(74) Attorney, Agent, or Firm — Seed IP Law Group LLP

(57) ABSTRACT

The invention concerns a method for monitoring a cable strand containing multiple electrical lines, such that the cable strand is designed to conduct electrical energy generated by a generator in a wind turbine involving the steps: measuring the temperature of at least two of the electrical lines, comparing the temperatures of said lines, and determining whether the two temperatures deviate from one another by more than a predefined threshold.

13 Claims, 2 Drawing Sheets

METHOD FOR MONITORING MULTIPLE ELECTRICAL ENERGY LINES IN A CABLE STRAND

BACKGROUND

Technical Field

This invention concerns a method for monitoring a cable strand containing multiple electrical lines, specifically electrical energy lines. Furthermore, this invention concerns a monitoring device for monitoring a cable strand containing multiple electrical lines, and this invention concerns a wind turbine.

Description of the Related Art

It is known that electrical energy from an electrical generator in a wind turbine can be transferred through electrical lines in a wind turbine tower down to the tower base, so that this electrical energy can be transferred on from there and/or processed further. In one well-known example, the generator generates alternating current, for example in the form of two three-phase alternating currents. These alternating currents are rectified in the nacelle, where the generator is located, and the direct current generated in this process is conducted from the nacelle via direct current lines, and therefore from the top of the tower downwards to the tower base. To achieve this, multiple identical lines are normally arranged in parallel to avoid the line being too thick and therefore difficult to handle, and the total line cross-section required is achieved by using multiple parallel-connected lines. For example, these lines may be electrically connected in the top of the tower and base of the tower via a terminal busbar. For example, this would allow 16 lines to be connected in parallel, such that they are electrically, and therefore galvanically, connected to one another at this busbar. The direct current generated is then supplied to this busbar or a similar component, and ideally will be uniformly distributed along the individual lines. The uniform distribution of the current on the electrical lines is basically limited physically. If all the lines are specifically of the same cross-section and the same length, i.e., about the length of the tower, they will have the same ohmic resistance, i.e., in general they will have the same impedance. Accordingly, each line carries the same current.

In reality, it may be that there are defects or at least unacceptable inaccuracies. This means, for example, that occasional high transfer resistances, interruptions, short-circuits or the like may occur, which may cause an excessively high current in one of the lines. Faulty or poorly connected individual lines can mean that less—or in the worst case, absolutely no—current flows, and the other lines must correspondingly take on and carry more current.

The German Patent and Trademark Office has researched the following prior art in the priority application for this application: DE 10 2009 021 217 A1 und EP 2 270 452 A2.

BRIEF SUMMARY

One or more embodiments of the present invention may address at least one of the above problems. Specifically, a simplified solution has been found to monitor the correct functionality of multiple parallel-connected lines to carry a current from a generator down through a tower. In particular, equipment costs may be kept as low as possible, and failure proneness can also preferably be kept as low as possible. At least one alternative solution shall be proposed.

In accordance with one embodiment of the invention, a method is provided. The method includes monitoring a cable strand with multiple electrical lines, where the cable strand is set up to carry electrical energy generated by a generator in a wind turbine. The cable strand therefore carries a corresponding current and in so doing, carries the energy generated by the generator. The current can therefore be generated for further processing, particularly by rectifying one of the currents generated by the generator.

Furthermore, the temperature will be measured on at least two of the electrical lines. This means that there are at least two line temperatures available, and these measured temperatures will be compared to one another, i.e., each temperature measured will be compared with the other temperature measured. By evaluating this comparison of the respective temperatures with one another, it is possible to find out whether the two temperatures are deviating by more than a predefined threshold. This therefore depends on the relationship between these temperatures. Of course, the absolute temperatures may also be considered, for example in order to identify an absolute overload of the lines. However, the invention-related proposal is based on comparing the two temperatures.

This is based on the idea that the lines are normally uniformly electrically charged, specifically that identical lines carry identical amounts of current. If a fault occurs, during which, for example, one of the lines has a poor contact or, for example, may be damaged, this line may have higher resistance and carry correspondingly less current. The remaining lines, specifically the at least one other line being monitored, will then carry correspondingly more current. As a result, these different currents lead to different levels of warming in the two lines, and therefore to different temperatures, and finally to a deviation in the comparative temperatures which exceeds the predefined threshold.

The temperatures in the line are affected by a range of other influences, such as the volume of the total current, which, in the wind turbine, is not least affected by the prevailing wind conditions. Moreover, corresponding environmental temperatures in the tower, i.e., at the site where the tower is installed, may influence the line temperature. These more or less external temperature influences affect the lines in the strand, which are identical or at least substantially alike. By logging the temperature differences, other fringe conditions can be excluded from the evaluation.

Furthermore, the example given of a reduction in line current, combined with an increase in current in another line, leads to a comparably large temperature difference and therefore is a suitable indicator for a problem in this cable strand.

The predetermined threshold, which can also be called marginal difference temperature, can be predefined from values already encountered or preliminary measurements taken prior to commissioning. Likewise, measuring and recording the temperatures in at least one initial test system on the respective lines should be considered, thereby identifying normal deviations in temperatures. Preferably, therefore, this threshold or marginal temperature difference will be set to a value that exceeds the normal variations recorded. If the temperature is logged on three or more lines, it may be useful to specify different thresholds i.e., marginal difference temperatures, particularly depending on which line is being compared with which other line. Such different thresholds can also be correspondingly specified through the preliminary measurements and preliminary recording of normal deviations, in particular of normal variations, described above.

The predefined thresholds can also be specified in advance and then adapted during system operation depending on preliminary measurements.

Preferably, a warning signal will be issued, which may also be considered to be a malfunction message, if it is determined that two temperatures deviate from one another by more than the predefined thresholds. Such a warning signal may be transmitted as an internal signal to a process computer or the like, which can implement additional steps, specifically slowing down the wind turbine, shutting down the wind turbine in case of an emergency, or alternatively or additionally sending a warning signal, such as to a control center via SCADA (supervisory control and data acquisition).

Preferably, the cable strand being monitored will be laid inside the wind turbine tower, and all of the energy generated by the generator—minus losses—will be transferred down the tower. Therefore, this monitoring process specifically concerns the monitoring of energy lines which primarily transmit electrical energy. Such energy lines are correspondingly laid out in such a way as to carry a high current, not just information. Such energy lines are also gathered into strands, which are intended to conduct an overall current, where this overall current is distributed as uniformly as possible over the lines making up the strand. A malfunction, or a malfunctioning connection of a line, will therefore lead to corresponding shifts in current distribution between the lines. Due to the relatively high currents anticipated, this will become thermally apparent and be logged by the proposed temperature comparison on the corresponding line.

Preferably, the lines in the cable strand being monitored will be connected in parallel to one another and therefore each one will be capable of carrying an equally high current. For this reason, the lines are essentially the same, i.e., of the same type, the same design and/or the same length and/or the same cross-section. They will necessarily be of the same length because the entire strand, and therefore each individual line, will preferably stretch from the top of the tower to the tower base, where a tower can in fact be replaced by a mast. If the line cross-section is now uniform, and the same material is used, such as copper or aluminum in particular, the electrical lines will also be approximately uniform in their electrical conductivity. Furthermore, if identical sheathing is used, the thermal insulation properties will also be the same. Preferably in any case, identical lines will be used everywhere to prevent the use of a line with a large cross-section, which—even if it were possible—would be difficult to handle.

Preferably, the temperature of all lines being monitored will be measured in a longitudinal direction of the cable strand and at the same point, specifically therefore at one connection or measuring point in the top of the tower or at one connection or measuring point in the tower base. This will prevent different measuring points, i.e., specifically different measuring heights, leading to different temperatures and thereby lessening the weight of the proposed comparison. Furthermore, a useful connection of the measuring sensors to an evaluation device, and further assessment of the data in the top of the tower, specifically in a nacelle in the wind turbine or in the tower base, is comparatively simple to implement. All measurements will then basically be collected at one point and evaluated there, or will at least be prepared for evaluation, such as by being digitalized.

When comparing two temperatures with one another, and determining whether these temperatures deviate from one another by more than a predefined threshold, one of the two temperatures may also be an average of several temperature readings. In this way, an average of all of the temperatures recorded, i.e., the temperatures of each line, can be calculated, and then each of the individual temperatures on each line can be compared with this average. In this case however, the requirement for accuracy may be somewhat greater than if two definitive measured temperatures are compared, but it is sufficient for a comparison of the temperature on each line, namely the comparison of this temperature with the average temperature. Therefore, for example, for ten lines only ten comparisons are carried out, if each temperature from each line is only compared with an average temperature. If the temperature on each line is compared with the temperature on all of the other lines, as proposed according to an embodiment, in the example given, 45 comparisons would be necessary.

Preferably, the temperature can be used as a type of power lever, which gives some indication of the power being transmitted. For example, a malfunction message may be emitted if an individual temperature deviation occurs. For example, this temperature deviation may be 5° C. Emitting a malfunction message when a maximum absolute temperature is exceeded is also proposed, if for example a line exceeds a temperature of 75° C.

The malfunction message in both situations described above may include an alarm contact, in which an alarm switch is switched, specifically short-circuited, which correspondingly can then be used for evaluation purposes. For example, it may trigger another alarm signal such as a warning lamp, and acoustic warning signal and/or system shut down. Furthermore or alternatively, the malfunction message can be set up to send a dataset. This can include the location and time, and any other necessary details, such as the definitively measured temperature, and accordingly be forwarded, specifically to a control center.

A monitoring device is also proposed. This monitoring device is designed to monitor a cable strand made up of multiple electrical lines, such that the cable strand can conduct electrically generated energy from a generator in a wind turbine. The monitoring device includes a temperature sensor on at least two of the electrical lines to measure the respective temperatures of these lines. Furthermore, a comparison device for comparing the temperatures with one another is planned, and an evaluation device for determining whether two temperatures, i.e., the temperatures on two lines, deviate by more than a predetermined threshold from one another. In particular, such a monitoring device is designed to be able to carry out a process in accordance with at least one of the embodiments described above.

The monitoring device will preferably also be equipped with a process computer for processing the temperatures measured, such that in particular the process computer may be the comparison device and/or the assessment device. Therefore, the monitoring process will be carried out partially or entirely on the process computer.

Preferably, each electrical line will be equipped with a temperature sensor to measure the temperature of each of these electrical lines and perform the comparisons described. It is beneficial to use a temperature-dependent precision resistor as a temperature sensor. This means that the temperature can easily be measured and electrically processed further. Likewise, it is simple to install this type of sensor on every line. This means that the proposed monitoring of each individual line can be carried out even where many electrical lines are grouped together in one strand. In the simplest case, this requires just one temperature sensor on each of the electrical lines being monitored and an evaluation unit to collect all temperature measurements and to evaluate them. Preferably, an evaluation unit or pre-evaluation unit will be installed between the sensor and the process computer to convert an analogue test signal into a digital signal, and/or to amplify a test signal.

If each line in the cable is monitored, this concerns the electrical lines connected in parallel which conduct the energy from the electrical generator in the wind turbine and therefore distribute the corresponding current between themselves. A strand means multiple energy lines gathered together which conduct this electrical energy that has been generated, irrespective of whether additional lines being used for another purpose are mechanically connected to this strand, such as data lines, grounding lines or earth conductors, which are excluded from monitoring.

The lines in this strand, and thus the strand overall, are preferably intended to carry direct current.

The connection in parallel of the electrical lines in the strand means that these lines are electrically conductive at one connection point at least, i.e., they are connected galvanically. This can specifically be at a collective terminal or collective busbar. The current to be conducted, which should be distributed between these individual lines, may for example be transmitted entirely to this busbar or terminal, and from there may be distributed uniformly between the individual electrical lines. A good, uniform electrical connection between each of these electrical lines and the busbar is, however, particularly important for balanced distribution of the current.

Furthermore, a wind turbine with a tower, a top and a tower base, and a generator installed in the top of the tower for producing electrical energy from wind is proposed. The generator will preferably be located in one of the nacelles installed at the top of the tower. Furthermore, the wind turbine will include one cable strand made up of multiple electrical lines to conduct the electrical energy generated by the generator specifically as direct current from the top of the tower to the tower base. In addition, a monitoring device is planned, as described above in relation to at least one embodiment in a monitoring device. Preferably, the wind turbine will monitor the multiple electrical lines in the cable strand, as has been described above in relation to the embodiment for the monitoring method.

Preferably, the cable strand will be laid in the tower and will conduct all of the energy generated by the generator, i.e., the entire output produced, down through the tower via the cable strand. Any losses during this will be disregarded. Preferably, the output generated by the generator will then be converted into direct current, so that this direct current can be transmitted by the cable strand.

Preferably, the lines in the cable strand will be connected in parallel to one another and therefore each one will be capable of carrying an equally high current. The electrical lines specifically have the same cross-section for this reason.

BRIEF DESCRIPTION OF THE SEVERAL VIEWS OF THE DRAWINGS

By way of example, the invention is described in more detail below by means of an exemplary embodiment, with reference to the accompanying figures.

DETAILED DESCRIPTION

Figure 1:
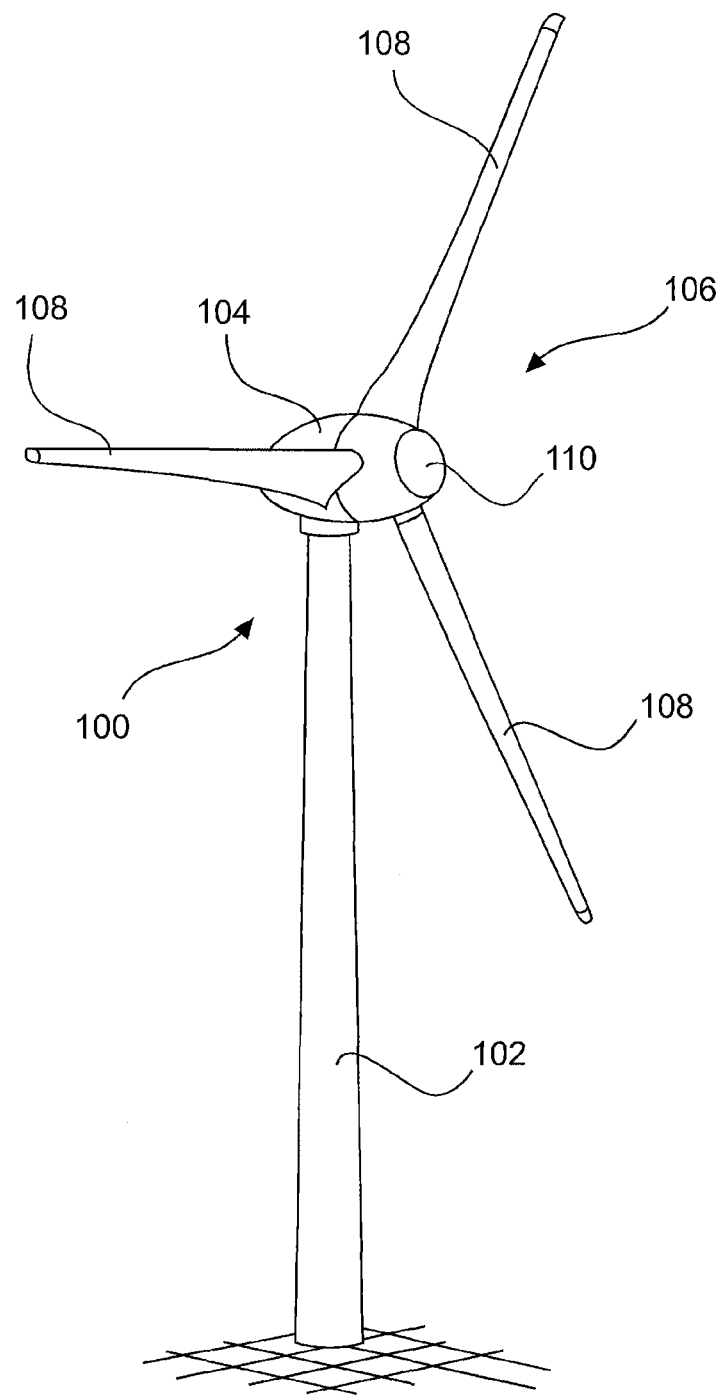
FIG. 1 shows a wind turbine to be used in a wind farm in a perspective view.

FIG. 1 shows a wind turbine 100 with a tower 102 and nacelle 104. Rotor 106 with three rotor blades 108 and spinner 110 is located on nacelle 104. The rotor 106 is set in operation by the wind in a rotating movement and thereby drives a generator in the nacelle 104.

Figure 2:
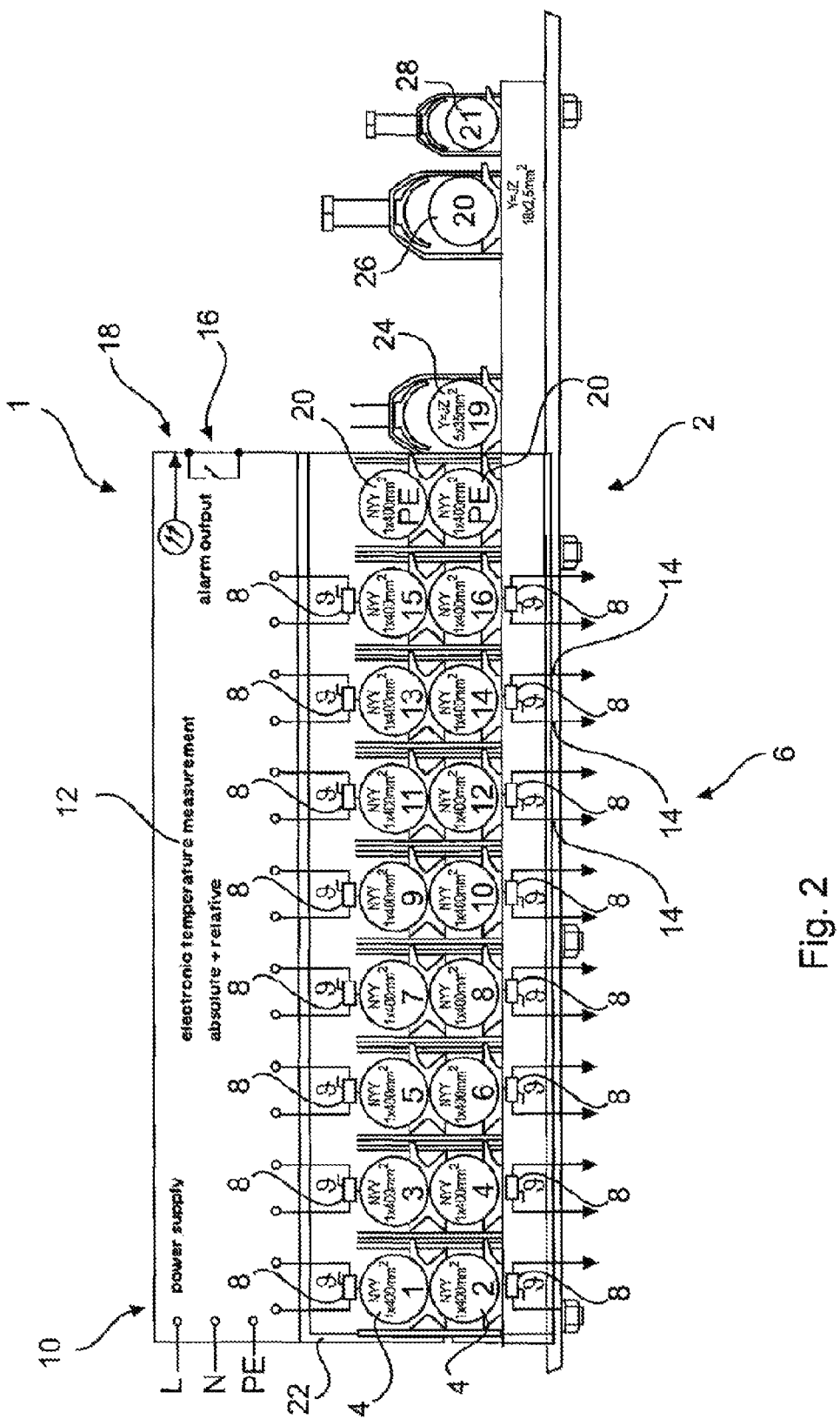
FIG. 2 shows a terminal bus with multiple electrical lines from a cable strand.

FIG. 2 shows a monitoring device 1 for monitoring a cable bundle 2, which can be described as a cable strand 2. The cable strand 2 has 16 electrical lines 4, shown here in cross-section. All of the electrical lines 4 have the same cross-section and specifically are of the same type and the same design. The type shown is specifically known as NYY1×400 mm$^2$. These 16 electrical lines 4 in the cable strand 2 are intended to carry a direct current, which transmits the entire electrical output of a generator in a wind turbine.

The electrical lines 4 in the cable strand 2 are shown together in FIG. 2 on a terminal device 6. Each of the electrical lines 4 is thereby equipped with a temperature sensor 8, which here is shown as a temperature-variable resistance. The temperatures measured by the temperature sensors 8 will be evaluated in monitoring device 1. The monitoring device 1 is therefore installed immediately beside the terminal device 6, which may be structurally advantageous during implementation. However, the location of the monitoring device 1 does not have to correspond to such a terminal device, but may be placed on another point along the cable strand 2. The use of a terminal device 6, however, also simplifies the layout of the temperature sensors 8 and thereby increases the reliability of the layout of the temperature sensors 8.

The monitoring device 1 includes a power input 10, the type of which may correspond to a normal electrical power supply. This allows the monitoring device 1, specifically a process computer within it, to be provided with electrical energy as a power source. The power input 10 is therefore part of an evaluation block 12, which can be described as the evaluation unit, which is only indicated here in a schematic manner. Signals from the temperature sensors 8 are evaluated in the evaluation block 12, specifically signals from all of the 16 temperature sensors 8 shown. Eight of the 16 temperature sensors 8, in accordance with the illustration in FIG. 2, point downwards and are provided with connecting wires 14 at the contact pins of the temperature sensor 8, which are represented symbolically as arrows in order to indicate that these are also evaluated in the evaluation block 12.

Alternatively, the energy supply for the evaluation block 12 may come via the data line, where the interface with the one or more data lines comes out, which can also be used as a power supply and as an emitting or receiving path.

The evaluation block 12 then compares the temperatures, which have been measured by a temperature sensor 8, and emits a malfunction message as soon as two temperatures differ from one another by more than a predefined value, specifically by more than a predefined differential temperature threshold. The malfunction message can therefore cause a switch on the alarm output 16 to be closed or opened. An electrical circuit or electrical evaluation circuit can be attached to this alarm output 16, so that such a switching signal can be externally evaluated, or generate another alarm signal or other type of warning message immediately by switching the alarm output 16. Switching can immediately trigger an action in the wind turbine, if necessary even shutting down the wind turbine.

In addition or alternatively, the alarm data output 18 can emit a data set containing the type and scope of malfunction measured. Such a dataset can specifically contain the time and location of the monitoring device or the location of the wind turbine affected. The temperatures recorded can also be definitively included in such a dataset. Therefore, the dataset will contain either the temperatures from all electrical lines 4 or only the temperature of the line which caused the deviation triggering a malfunction message.

As well as monitoring temperature differences, i.e., in addition to comparing the temperatures in electrical lines with one another, the monitoring device 1 also monitors absolute temperatures.

In the terminal device 6, there are also two earthing lines 20, which are normally described as PE (protective earth) lines, but according to regulations should not carry any current and therefore also have no temperature sensors. The 16 electronic lines 4 and these two PE lines 20 will be held in a housing 22. Outside the housing 22, there will also be a safety line 24 and an additional auxiliary line 26 and an optical fiber 28, which the wind turbine can use, but which are not important for the monitoring device 1 and the monitoring process being carried out by it.

In this way, to protect the tower cabling from overloading, specifically where there are multiple electronic lines laid in parallel, monitoring is proposed. This is based on different temperatures in the individual conductors, therefore in the individual electrical lines, due to variable currents which may be limited by high transfer resistances, interruptions, short-circuits or other events.

The proposed monitoring is intended to offer protection to each of the individual electrical lines in the tower cabling against overloading.

The background is that each current-carrying conductor is heated proportionally, i.e., depending on the strength of the current. Electrical lines and cables in general are specified up to a maximum operating temperature. For example, the NYY type cable is designed to withstand a surface temperature up to +70° C. The parallel connection of two or more lines distributes the current in an ideal manner, uniformly across all lines. This means that when using lines of the same type and the same length and design, the heating is the same. Malfunctions or technical defects caused by faulty production, assembly, installation or operation of the line can lead to increased conductivity resistance in inverse ratio to the current flow. The reduced current flow in an affected line causes an increase in current in the other lines connected in parallel, and therefore an increase in temperature. The temperature difference is meteorologically determined, evaluated and recognized as an error. An absolute temperature measurement of each individual line means that when the maximum permissible surface temperature is reached, which for a line of type NYY may be 70° C., the wind turbine output is reduced or the turbine is stopped.

The proposed monitoring or monitoring device, which overall can be described as a measuring and monitoring system, stands out due to its extreme flexibility in application. The proposed system basically works independently of the type of cable or the number of lines. The monitoring device and the corresponding methods do not necessarily need to be used inside the tower, but can also be used at other points where the strand of electrical lines runs, such as in the nacelle or in an additional building for electrical equipment. This is due to the fact that the current flow in the electrical lines is identical over the entire length of each line.

The invention claimed is:

1. A method comprising:
    generating electrical energy by a generator of a wind turbine;
    providing the generated electrical energy to a cable strand, the cable strand including direct current (DC) electrical energy lines, wherein at least two of the DC electrical energy lines are coupled to each other in parallel;
    measuring a temperature of the at least two DC electrical energy lines that are coupled to each other in parallel;
    comparing the temperatures of said at least two DC electrical energy lines; and
    determining whether the two temperatures deviate from one another by more than a predefined threshold.

2. The method according to claim 1, further comprising initiating a malfunction message when it is determined that the two temperatures deviate from one another by more than the predetermined threshold.

3. The method according to claim 1, wherein the cable strand is located inside a tower, and wherein the electrical energy generated by the generator, excluding losses, is transmitted down the tower.

4. The method according to claim 1, wherein the DC electrical energy lines are configured to carry a substantially equal current.

5. The method according to claim 1, wherein measuring the temperature of the at least two DC electrical energy lines comprises measuring in a longitudinal direction of the cable strand and at a same point for each line, wherein the same point is a top of a tower or at a base in the tower.

6. A monitoring device for monitoring a cable strand containing multiple direct current (DC) electrical energy lines, wherein the cable strand is configured to conduct electrical energy generated by a generator in a wind turbine, the monitoring device comprising:
    temperature sensors respectively coupled to at least two of the DC electrical lines contained in the cable strand, each temperature sensor being configured to measure the temperature of the respective DC line to which it is coupled, wherein the at least two of the DC electrical lines are coupled to each other in parallel;
    a comparison device coupled to the temperature sensors and configured to receive signals indicative of the measured temperature of the DC electrical lines and to compare the measured temperatures; and
    an evaluation device coupled to the comparison device and configured to determine whether the measured temperatures deviate from one another by more than a predefined threshold.

7. The monitoring device according to claim 6, further comprising process computer configured to initiate a malfunction message when the measured temperatures deviate from one another by more than the predefined threshold.

8. The monitoring device according to claim 6, further comprising a process computer for processing the measured temperatures, wherein the process computer includes at least one of the comparison device and the evaluation device.

9. The monitoring device according to claim 6, wherein each temperature sensor includes a temperature-dependent precision resistor.

10. A wind turbine comprising:
    a tower having a top and a tower base,
    a generator installed in the top of the tower, the generator being configured to generate electrical energy from wind,
    a cable strand containing a plurality of direct current (DC) electrical lines that are coupled to each other in parallel and configured to conduct the electrical energy generated by the generator, wherein the electrical energy is a direct current that travels from the top of the tower to the tower base, and
    a monitoring device for monitoring the cable strand, the monitoring device including:

temperature sensors coupled to at least two of the DC electrical lines that are coupled to each other in parallel, respectively, each temperature sensor being configured to measure the temperature of the respective line to which it is coupled;

a comparison device coupled to the temperature sensors and configured to receive signals indicative of the measured temperature of the DC electrical lines and to compare the measured temperatures; and an evaluation device coupled to the comparison device and configured to determine whether the measured temperatures deviate from one another by more than a predefined threshold.

11. The wind turbine according to claim 10, wherein the cable strand is located inside the tower and the energy generated by the generator, excluding any losses, is transmitted from the top of the tower to the tower base.

12. The wind turbine according to claim 10, wherein each DC electrical line is configured to carry a substantially equal current.

13. The wind turbine according to claim 12, wherein each of the DC electrical lines have substantially a same shape in cross section.

* * * * *